United States Patent [19]
Ema

[11] Patent Number: 5,496,758
[45] Date of Patent: Mar. 5, 1996

[54] FABRICATION PROCESS OF A SEMICONDUCTOR MEMORY DEVICE HAVING A MULTIPLE WELL STRUCTURE IN A RECESSED SUBSTRATE

[75] Inventor: Taiji Ema, Kawasaki, Japan

[73] Assignee: Fujitsu Limited, Kawasaki, Japan

[21] Appl. No.: 355,489

[22] Filed: Dec. 14, 1994

[30] Foreign Application Priority Data

Mar. 1, 1994 [JP] Japan .................................... 6-031611

[51] Int. Cl.$^6$ .............................. H01L 21/70; H01L 27/00
[52] U.S. Cl. .................. 437/52; 437/47; 437/60; 437/919
[58] Field of Search ........................... 437/47, 52, 60, 437/919

[56] References Cited

U.S. PATENT DOCUMENTS

| | | | |
|---|---|---|---|
| 4,696,092 | 9/1987 | Doering et al. | 437/52 |
| 4,882,289 | 11/1989 | Moriuchi et al. | 437/52 |
| 5,286,666 | 2/1994 | Katto et al. | 437/52 |

FOREIGN PATENT DOCUMENTS 2-77153  3/1990  Japan .

OTHER PUBLICATIONS

Yoshikawa et al., Dig. Tech. Papers, Symp. VLSI Technology, 1989, pp. 67–68 "Process Technologies for a High Speed 16 MDRAM with Trench Type Cell".

Sagara et al., Dig. Tech. Papers, Symp. VLSI Technology, 1992, pp. 10–11 "A 0.72 um$^2$ Recessed STC (RSTC) Technology for 256 MBit DRAMs Using Quarter-Micron Phase Shift Lithography".

*Primary Examiner*—Mary Wilczewski
*Assistant Examiner*—H. Jey Tsai
*Attorney, Agent, or Firm*—Armstrong, Westerman, Hattori, McLeland & Naughton

[57] ABSTRACT

A method for fabricating a semiconductor memory device includes the steps of forming, in a semiconductor substrate of a first conductivity type, a well of a second opposite conductivity type by protecting the substrate surface except for a part where the well of the second conductivity type is to be formed, oxidizing the exposed surface of the semiconductor substrate while using the same mask pattern to form a thick oxide film on the surface of the well, and removing the thick oxide film by an etching process to form a recessed surface on the well.

6 Claims, 5 Drawing Sheets

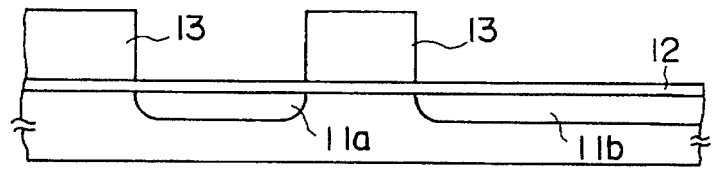
FIG. IA
PRIOR ART
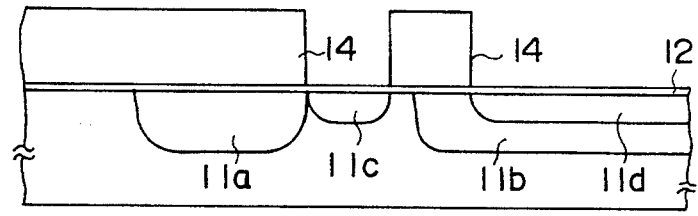
FIG. IB
PRIOR ART
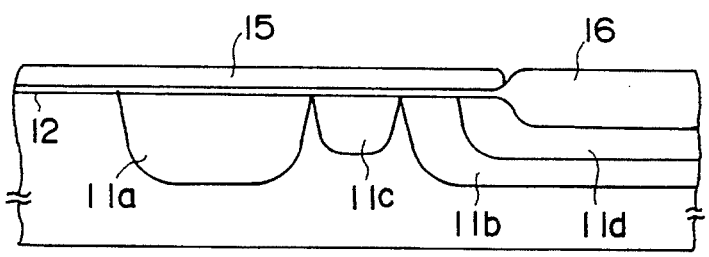
FIG. IC
PRIOR ART
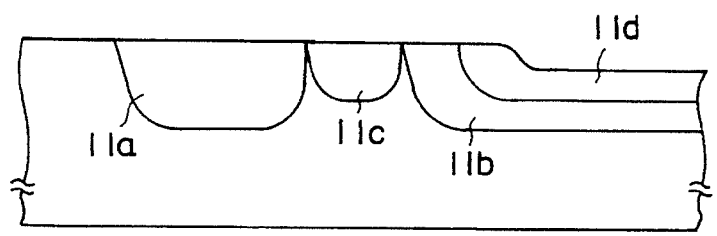
FIG. ID
PRIOR ART
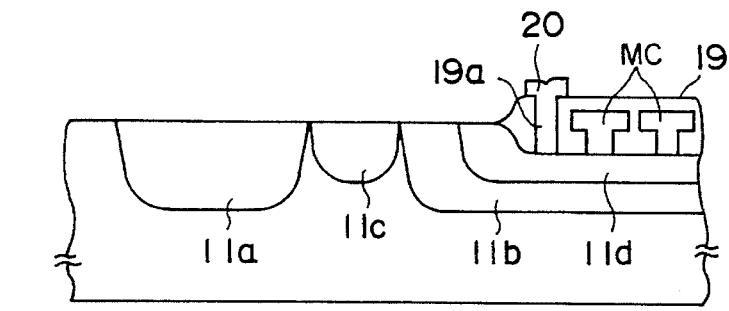
FIG. IE
PRIOR ART

FABRICATION PROCESS OF A SEMICONDUCTOR MEMORY DEVICE HAVING A MULTIPLE WELL STRUCTURE IN A RECESSED SUBSTRATE

BACKGROUND OF THE INVENTION

The present invention generally relates to semiconductor memory devices and more particularly to a fabrication process of a dynamic random access memory (DRAM) that stores information in a capacitor in the form of electric charges.

In semiconductor memory devices that store information in the form of electric charges such as a DRAM, it is generally practiced to employ a multiple-well structure in which a memory cell is provided in a first well of a first conductivity type formed in a second well of a second, different conductivity type. By employing such a multiple-well structure, it is possible to absorb unwanted positive and negative electric charges, which are created upon incidence of alpha particles into the semiconductor substrate, by the wells of the respective conductivity types. Thereby, the problem of destruction of information stored in the memory device by such charged particles is substantially reduced. Yoshikawa et al, Dig. Tech, Papers, Symp. VLSI Technology 1989, pp. 67–68 describes such a DRAM that uses the multiple-well construction for the peripheral circuits of the DRAM.

Meanwhile, there has been a problem in the conventional fabrication process of DRAMs having a large integration density, in that the height of the memory cell capacitor has to be increased relatively with respect to the lateral size thereof, in order to compensate for the decrease of capacitance caused as a result of miniaturization of the device. When the height of the memory cell capacitor is increased as such, on the other hand, the height or level of the chip surface for the region on which a memory cell array is formed, increases as compared with the region on which a peripheral circuit such as sense amplifier is formed. In other words, there appears a step at the boundary between the memory cell array region and the peripheral circuit region on a common semiconductor chip.

It should be noted that high resolution optical exposure systems, used for exposing integrated circuits of very large integration density, generally uses a high resolution optical system having a large numerical aperture. As an optical system having a large numerical aperture has an extremely limited focal depth, it will be noted that existence of such a step on the chip causes a substantial difficulty in exposing a conductor pattern extending continuously from the memory cell array region to the peripheral circuit region.

In order to avoid this problem, it is proposed to minimize the step height on the chip by lowering the level of the memory cell array region with respect to other regions of the chip. For example, Sagara, K., et al., Dig. Tech. Papers, Symp. VLSI Technology, 1992, pp. 10–11 describes a process in which the memory cell array region is first oxidized to form an oxide film of substantial thickness, followed by an etching process for selectively removing the oxide film thus formed. According to the process of the foregoing reference, it will be noted that there is formed a recess structure on the semiconductor chip in correspondence to the memory cell array region.

FIGS. 1A–1D show a conventional process of fabricating a semiconductor memory device having such a recess structure on a silicon substrate including the process for forming a multiple well structure in correspondence to the memory cell array region and a twin well structure in correspondence to the peripheral circuit region, wherein the twin well structure is a structure in which a p-type well and an n-type well are formed adjacent with each other side by side in a silicon substrate.

Referring to FIG. 1A, a thin silicon oxide film 12 is formed on a surface of a p-type silicon substrate 11 by means of a thermal oxidation process conducted in a dry oxygen environment. Further, the silicon oxide film 12 is subjected to a spin coating process of photo resist to form a resist layer not illustrated, followed by a photolithographic patterning process of the resist layer to form a resist pattern 13. Further, an ion implantation process of n-type dopant such as As or P is conducted into the substrate 11 through the oxide film 12 while using the resist pattern 13 as a mask. After removing the mask 13, an annealing process is conducted for causing a diffusion of the dopants. As a result, n-type wells 11a and 11b are formed as indicated in FIG. 1A. In FIG. 1A, it should be noted that the well 11a corresponds to the peripheral circuit, while the well 11b corresponds to the memory cell array region.

Next, in a step of FIG. 1B, a new resist pattern 14 is formed on the structure of FIG. 1A by a spin coating process, followed by a photolithographic patterning process similarly as before. Further, by conducting an ion implantation of p-type dopants such as B into the substrate while using the pattern 14 as a mask, it is possible to form a p-type well 11c such that the well 11c is located adjacent to the well 11a. Further, another p-type well 11d is formed inside the n-type well 11b in the memory cell array region as indicated in FIG. 1B.

Next, in a step of FIG. 1C, the resist pattern 14 is removed, and an annealing process is conducted for causing the diffusion of the dopants. Next, a SiN layer and a resist layer are deposited successively upon the silicon oxide film 12 covering the surface of the substrate 11, and a photolithographic patterning process is applied to the SiN layer to form a SiN pattern 15. After the SiN pattern 15 is formed, the resist pattern used for the patterning of the SiN layer is removed, and a thermal oxidation process is conducted in a wet oxygen environment to form a thick oxide film 16 in correspondence to the part of the substrate not protected by the SiN mask 15 as indicated in FIG. 1C.

Next, the silicon oxide film 16 is removed by an etching process and a structure of FIG. 1D is obtained. In FIG. 1D, it will be noted that there is formed a recess structure in the well 11d in correspondence to the memory cell array region. Further, a memory cell capacitor MC and an insulation layer 19 covering the memory cell capacitor MC are formed on the p-type well 11d as indicated in FIG. 1E, and a contact hole 19a is formed in the insulation layer 19. By providing an electrode 20 such that the electrode 20 fills the contact hole 19a, it is possible to bias the well 11d at a desired level.

In the conventional process of FIGS. 1A–1D, it will be noted that three mask processes are required as indicated in FIGS. 1A, 1B and 1C, wherein each masking process includes various processes such as deposition of SiN and resist layers, patterning of the resist layer by a photolithographic process, patterning of the SiN layer by using a resist mask, removal of the resist mask and the SiN mask, and so on. Thus, the process of FIGS. 1A–1D is expensive for fabricating a DRAM.

Further, the conventional process described before has another drawback in that it is necessary to provide the contact hole 19a thorough the thick oxide film 16, while the exposure of such a deep contact hole by a high resolution optical system inevitably raises a problem of limited focal depth. In addition, the process to fill such the contact hole 19 having a large aspect ratio by the electrode 20 tends to cause a problem of poor step coverage.

SUMMARY OF THE INVENTION

Accordingly, it is a general object of the present invention to provide a novel and useful fabrication process of a semiconductor memory device wherein the foregoing problems are eliminated.

Another and more specific object of the present invention is to provide a fabrication process of a semiconductor memory device having a multiple well structure in a substrate, with a recess structure formed on the substrate in correspondence to a memory cell array region, wherein the number of the fabrication steps is reduced substantially.

Another object of the present invention is to provide a process for fabricating a semiconductor memory device, comprising the steps of:

forming, on a first region of a semiconductor substrate of a first conductivity type, a first well of a second, opposite conductivity type;

a mask process for forming a mask pattern on a surface of said semiconductor substrate, such that a second region, which is included in said first region, is exposed;

introducing an impurity element of said first conductivity type into the surface of said semiconductor substrate in correspondence to said second region while using said mask pattern as a mask;

causing a diffusion of said impurity element in said semiconductor substrate to form a second well of said first conductivity type in said first well in correspondence to said second region;

causing an oxidation of the surface of said semiconductor substrate while using said mask pattern as a mask, to form an oxide layer on said second well such that said oxide layer covers said second well; and removing said oxide layer to form a recessed surface on the surface of said semiconductor substrate in correspondence to said second region, such that said recessed surface has a level lower than a level of a surface of said first region.

According to the present invention, the mask process for forming the second well and the mask process for causing the oxidation of the semiconductor surface in correspondence to the recessed surface, are achieved by a single, common mask process. Thereby, the number of the fabrication steps decreases as compared with the conventional fabrication process in the case when fabricating a semiconductor memory device shown in FIG. 1D wherein the multiple well structure is formed in the substrate and a recess structure formed in the memory cell array region. By providing a memory cell capacitor in such a recessed surface, it will be noted that the foregoing problem of focal depth of the optical exposure system due to the increased height of the memory cell capacitor, decreases substantially. It should also be noted that such a semiconductor memory device having a multiple well structure is less vulnerable to defective operation even when hit by radioactive particles.

In a preferred embodiment of the present invention, said step of diffusion and said step of oxidation are conducted substantially simultaneously. As a result of the embodiment, it is possible to improve the throughput of fabrication of the semiconductor memory device.

In another preferred embodiment of the present invention, said method further includes the steps of forming a memory cell array on said second region by forming memory cell transistors and corresponding memory cell capacitors on said recessed surface; and providing a planarized insulator layer having a planarized surface on said semiconductor substrate such that said planarized insulator layer covers said memory cell transistors and said memory cell capacitors. As a result of the embodiment, it is possible to reduce the step height between the peripheral circuit region and the memory cell array region on the surface of the planarized insulator layer, and the exposure of conductor patterns extending between the peripheral circuit region and the memory cell array region by means of high resolution optical system is facilitated even when the conductor pattern has a submicron width.

In a modification of the foregoing preferred embodiment of the present invention, said method further includes the steps of: forming a conductive region in said semiconductor substrate such that said conductive region extends from said recessed surface to a surface of said first region; providing a contact hole on said planarized insulator layer in correspondence to said first region such that said contact hole exposes said conductive region; and filling said contact hole by a conductive material to form an electrode such that said electrode establishes an electrical contact with said exposed conductive region.

In another preferred embodiment of the present invention, said step for forming said first well comprises the steps of: forming a second mask pattern on said semiconductor substrate in correspondence to a third region so as to expose said first region; introducing an impurity element of said second conductivity type into said semiconductor substrate in correspondence to said first region while using said second mask pattern as a mask; and causing a diffusion of said impurity element of said second conductivity type in said first region.

In a modification of the foregoing preferred embodiment of the present invention, said method further comprises the steps of: oxidizing said semiconductor substrate to form an oxide film while using said second mask pattern as a mask, such that said oxide film covers said first region of said semiconductor substrate; removing said second mask pattern from said third region; introducing a second impurity element of said first conductivity type into said third region while using said oxide film as a mask; and causing a diffusion of said second impurity element in said third region to form a third well; wherein said step of forming said oxide film that covers said first region is conducted substantially simultaneously to said process of causing the diffusion of said second impurity element. According to the present embodiment, it is possible to form the first well and the third well by using the same mask process such that the first and third wells are adjacent with each other, wherein the first well is in the memory cell array region while the third well is in the peripheral circuit region. Thereby, the fabrication process of the semiconductor device is substantially simplified.

Another object of the present invention is to provide a semiconductor memory device, comprising:

a semiconductor substrate defined with a peripheral circuit region for carrying peripheral circuits and a memory cell array region for carrying a memory cell array;

a first well of a first conductivity type formed in said semiconductor substrate in correspondence to said memory cell array region, said first well having a surface at a first level;

a second well of a second, opposite conductivity type formed in said first well, said second well having a surface at a second level lower than said first level, said surface of said second well being separated from said surface of said first well by a stepped boundary;

a memory cell transistor provided on said second well;

a memory cell capacitor provided on the surface of said second well so as to extend in an upward direction therefrom;

an insulating film provided on said memory cell array so as to cover said memory cell transistor and said memory cell capacitor;

a conductive region provided on said semiconductor substrate so as to extend from the surface of said second well to the surface of said first well across said stepped boundary;

a contact hole provided on said insulating film in correspondence to said first well so as to expose said conductive region; and an electrode filling said contact hole to establish an electrical contact with said conductive region.

According to the present invention, it is possible to reduce the depth of the contact hole penetrating through the insulating film by providing the conductive region such that the conductive region extends along the surface of the substrate from the second well to the first well across the stepped boundary. Thereby, it is possible to reduce the difficulty of exposing such a contact hole by the high resolution optical system. Because of the reduced aspect ratio of the contact hole, the step coverage of the electrode filling the contact hole is substantially improved.

Other objects and further features of the present invention will become apparent from the following detailed description when read in conjunction with the attached drawings.

BRIEF DESCRIPTION OF THE DRAWINGS

FIGS. 1A–1E are diagrams showing a conventional fabrication process of a DRAM that has a recessed surface in correspondence to a multiple well structure formed in a semiconductor substrate;

DETAILED DESCRIPTION OF PREFERRED EMBODIMENTS

FIGS. 2A–2H show a fabrication process of a semiconductor memory device according to a first embodiment of the present invention.

Figure 2A:
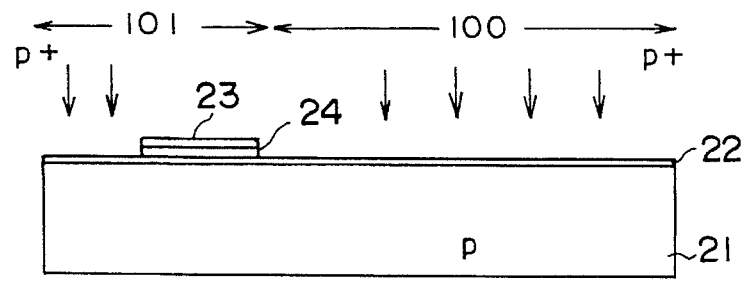
FIGS. 2A–2H are diagrams showing the fabrication process of a DRAM according to a first embodiment of the present invention.

Referring to FIG. 2A, a p-type Si substrate 21 is subjected to a thermal oxidation process at a temperature of 1000° C. in a dry oxygen environment to form a thin silicon oxide film 22 with a thickness of about 50 nm. It should be noted that the substrate 21 is defined by a memory cell array region 100 on which the memory cell array is to be formed and a peripheral circuit region 101 on which the peripheral circuit is to be formed. It will be noted that the silicon oxide film 22 is formed uniformly over the memory cell array region 100 and the peripheral circuit region 101.

Further, a thin SiN film is deposited upon the silicon oxide film 22 thus formed by a CVD process with a thickness of about 100 nm. The substrate 21 thus covered by the silicon oxide film 22 and the SiN film thereon is then subjected to a spin coating process to form a photoresist layer on the SiN film, followed by a photolithographic patterning process of the same to form a resist pattern 23, such that the resist pattern 23 covers the SiN film in correspondence to a part of the peripheral circuit region on which a p-type well is to be formed. The SiN film thus covered by the resist pattern 23 is then subjected to a reactive ion etching (RIE) process that uses a mixture of $CF_4$ and $O_2$ as an etching gas. As a result of such an etching process, a SiN pattern 24 is formed under the resist pattern 23 as indicated in FIG. 2A. In FIG. 2A, it will be noted that the resist pattern 23 and hence the SiN pattern 24 thereunder are so formed as to expose the surface of the silicon substrate 21, covered by the thin oxide film 22, in correspondence to the memory cell array region 100 and a part of the peripheral circuit region 101 on which an n-type well is to be formed.

Further, an ion implantation of n-type dopant such as $P^+$ or $As^+$ is conducted into the substrate 21 while using the resist pattern 23 and the SiN pattern 24 thereunder as a mask, and as a result, the n-type dopant is introduced into the unprotected part of the substrate 21. When $P^+$ is used as the dopant, the ion implantation is conducted under the acceleration voltage of typically 150 keV with a dose of typically $2\times10^{13}/cm^2$.

Figure 2B:
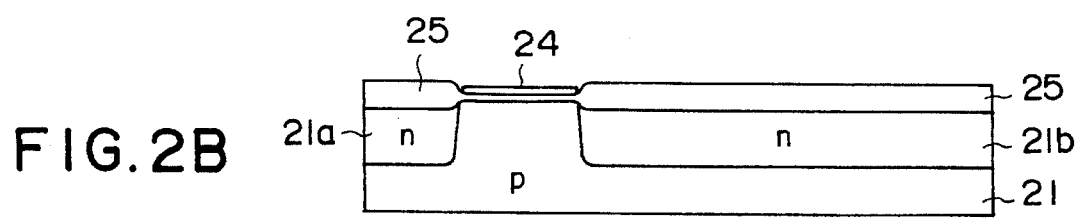

Next, the resist pattern 23 is removed in a step of FIG. 2B by dissolving the same into organic solvent, and a thermal oxidation process is conducted upon the substrate 21 in a wet oxygen environment at a temperature of 900° C. while using the SiN pattern 24 as a mask. As a result of the thermal oxidation process, a thick oxide film 25 is formed with a thickness of about 200 nm. In such a thermal oxidation process, it should also be noted that the n-type dopants introduced in the step of FIG. 2A experience a diffusion into the substrate 21, and an n-type well 21a is formed in correspondence to the peripheral circuit region. Simultaneously, a p-type well 21b is formed in correspondence to the memory cell region.

Figure 2C:
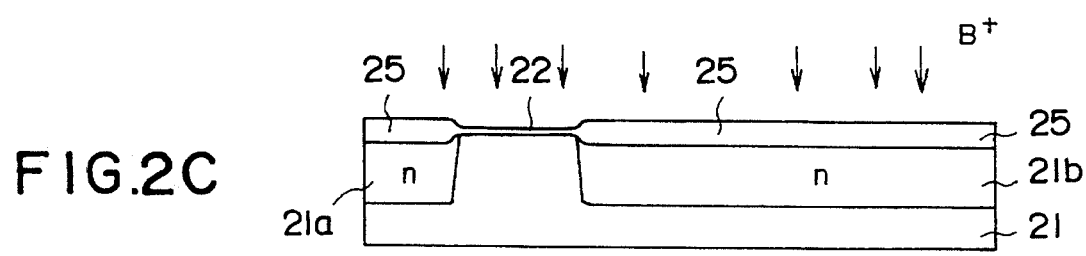

Next, in a step of FIG. 2C, the SiN pattern 24 is etched away by pyrophosphoric acid, and an ion implantation of $B^+$ is conducted into the substrate 21 via the silicon oxide film 22 while using the thick silicon oxide film 25 as a mask. Typically, the ion implantation of $B^+$ is conducted under an acceleration voltage of 25 keV with a dose of $1\times10^{13}/cm^2$. Further, by conducting a thermal driving process at 1000°–1200° C., the boron ions thus injected cause a diffusion into the interior of the substrate 21, and a p-type well 21c is formed. After the well 21c is formed, a wet etching process is conducted to remove the silicon oxide films 22 and 25, and one obtains the structure of FIG. 2D.

Figure 2D:
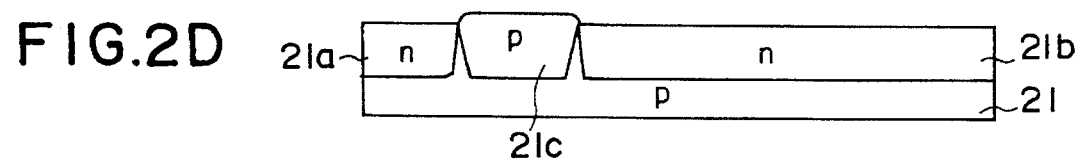

Next, a SiN film and a resist layer are deposited successively upon the structure of FIG. 2D, followed by a photolithographic patterning process of the resist layer thus deposited. Further, the SiN film is subjected to a patterning process while using the resist pattern thus formed as a mask.

Figure 2E:
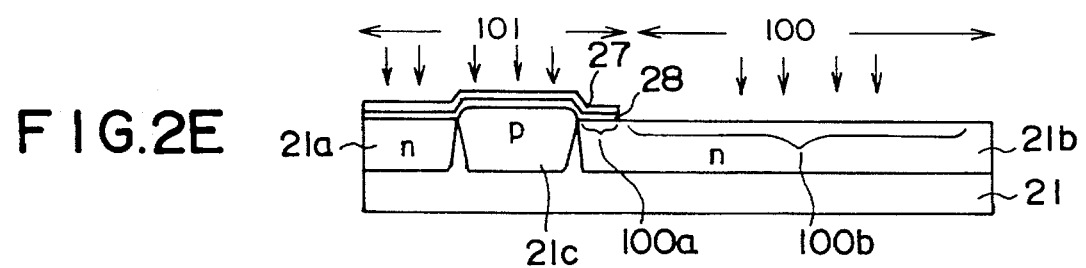

More specifically, the SiN film is provided on the entire surface of the structure of FIG. 2D with a thickness of about 100 nm, and the resist layer is provided on the SiN film by a spin coating process. By exposing and developing the resist layer thus formed, a resist pattern 27 is formed such that the resist pattern 27 covers the foregoing peripheral circuit region 101 as well as a marginal region 100a defined in the memory cell region 100. By conducting a patterning of the SiN film underneath the resist pattern 27 while using the pattern 27 as a mask, it is possible to obtain a SiN pattern 28 protecting the peripheral circuit region 101 as indicated in FIG. 2E. In the structure of FIG. 2E, it should be noted that a main region 100b of the memory cell region 100, which is a region excluding the marginal region 100a, is exposed.

In the step of FIG. 2E, an ion implantation of B$^+$ is conducted further into the main region 100b of the memory cell region 100 while using the resist pattern 27 and the SiN pattern 28 as a mask. Typically, the ion implantation of B$^+$ is conducted under the acceleration voltage of 150 keV with the dose of $1.5 \times 10^{13}$cm$^2$.

Figure 2F:
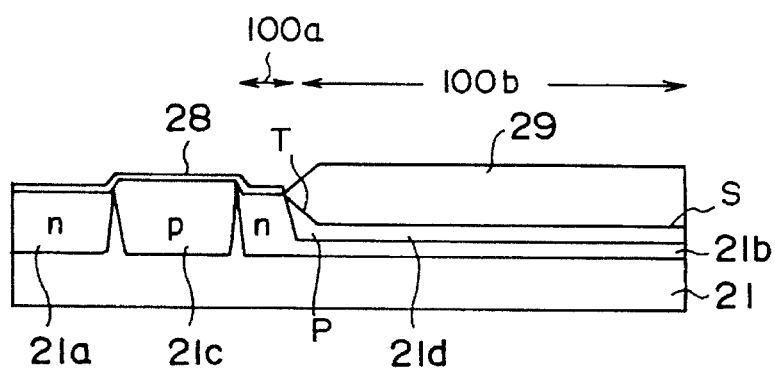

Next, in the step of FIG. 2F, the resist pattern 27 is removed by dissolving into a solvent, and an oxidization process is conducted upon the substrate 21 at a temperature of 1100°–1200° C. in a wet oxygen environment, while using the SiN pattern 28 as a mask. Thereby, there is formed a thick oxide film 29 on the substrate 21 in correspondence to the region 100b, with a thickness of about 800 nm. As a result of formation of such a thick oxide film, there is formed a surface S on the silicon substrate 21 in correspondence to the region 100b as indicated in FIG. 2F, such that the surface S is located at a level lower than the level of the region 100a by about 400 nm. In other words, there is formed a recess surface on the surface of the substrate 21 in correspondence to the region 100b, with a step T formed between the region 100a and the region 100b. Similar steps are formed also between the p-type well 21c and the n-type well 21a and between the p-type well 21c and the region 100a, while the step T is predominant as compared with other steps. As will be described later, the height of the step T is set so as to correspond to half of the height of the memory cell capacitor, which is to be formed on the main region 100b. In the step of FIG. 2F, it should further be noted that the injected B ions form a p-type well 21d inside the n-type well 21b as a result of diffusion caused in response to the formation of the oxide film 29.

Figure 2G:
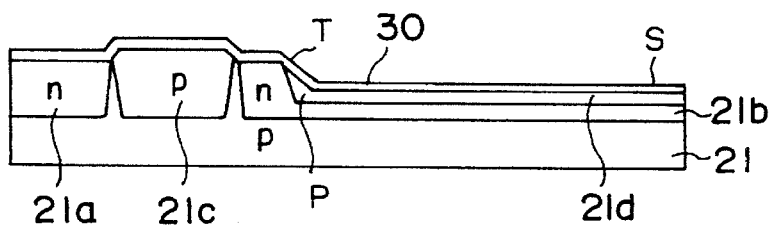

Next, in the step of FIG. 2G, the SiN pattern 28 is removed by dissolving the same into a pyrophosphoric solution, followed by an etching process of the thick oxide film 29 by a HF solution. As a result, the foregoing recessed surface S of the silicon substrate 21 is exposed. The recessed surface S thus exposed is then subjected to a thermal oxidation process conducted at about 1000° C. in a dry oxygen environment, to form a thermal oxide film 30 having a thickness of about 10 nm. The oxide film 30 thus formed serves for the gate oxide film of various MOS transistors to be formed later on the memory cell array region 100 as well as on the peripheral circuit region 101. More specifically, it should be noted that the step of FIG. 2G includes various process steps such as oxidation, deposition of a SiN layer, patterning of the SiN layer thus deposited to form a SiN pattern acing as a mask, formation of a field oxide film while using the SiN pattern as a mask, removal of the SiN pattern, formation of a gate oxide film, deposition and patterning of a gate electrode, ion implantation of dopants to form souce and drain regions, and the like. As these processes are well known, further description thereof will be omitted.

Figure 2H:
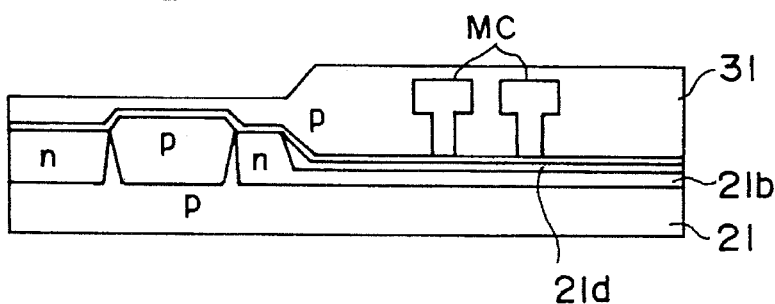

Further, in the step of FIG. 2H, a memory cell capacitor MC is formed on the recessed surface S corresponding to the foregoing p-type well 21, and various transistors constituting the peripheral circuit are formed on the n-type well 21a as well as on the p-type well 21c in the peripheral circuit region 101. It should be noted that the memory cell capacitor MC in the memory cell array region 100 has a height set to be generally equal to one-half the height of the step T between the marginal region 100a and the main region 100b. Thereby, the problem of focal depth is successfully eliminated when pattering a gate electrode on the recessed surface S and when pattedrning a conductor pattern extending over the memory cell array to the peripheral circuit region. Further, a planarization film 31 of SOG, and the like, is provided on the substrate 21 so as to bury the memory cell transistor MC.

As a result of such a construction, it is possible to minimize the step height of the conductor pattern extending on the planarization film 31 between the peripheral circuit and the memory cell. In other words, it is possible to conduct patterning of fine conductor patterns having a submicron pattern width in the DRAM of FIG. 2H by using a high resolution optical system, without experiencing the problem of limited focal depth.

In the fabrication process of FIGS. 2A–2H, it should be noted that the wells 21a and 21b are formed by the same mask process shown in FIGS. 2A and 2B. Similarly, the mask process of FIGS. 2E and 2F is used not only for the formation of the well 21d but also for the formation of the recessed surface S. Thus, the present invention reduces the number of the steps for fabricating a DRAM substantially. It should be noted that each of the foregoing mask steps includes a series of steps such as deposition of a SiN film, deposition of a resist layer, exposure and development of the resist layer to form a resist pattern, patterning of the SiN film by using the resist pattern as a mask, and the like. Thus, the foregoing reduction of the fabrication steps achieved by the present invention is substantial and by no means trivial.

Figure 3:
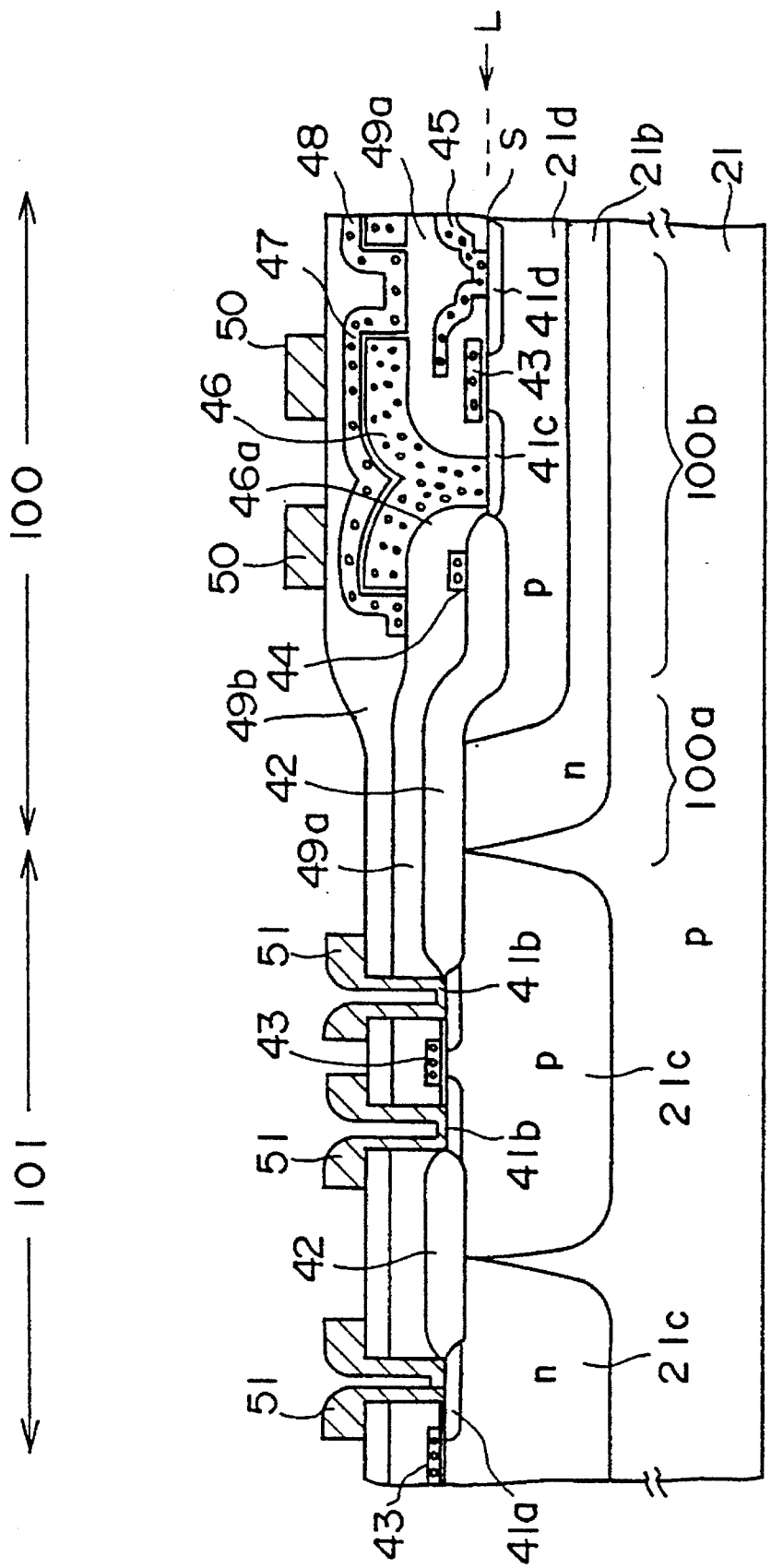
FIG. 3 is a diagram showing the structure of a DRAM fabricated according to the first embodiment process of the present invention.

FIG. 3 shows the structure of a DRAM constructed on the semiconductor substrate 21 according to the process of FIGS. 2A–2H in detail, wherein those parts described previously are designated by the same reference numerals and the description thereof will be omitted.

Referring to FIG. 3, the DRAM uses a so-called stacked type capacitor electrode, and the transistors that form the sense amplifier or other peripheral circuits are provided on the peripheral circuit region 101. Similarly, the transistors that form the memory cell transistors are provided on the memory cell array region 100, In each of the regions 100 and 101, the transistors are provided on an active region defined by a field oxide film 42.

In the n-type well 21a formed on the peripheral circuit region 101, a pair of p$^+$-type diffusion regions 41a are formed as a source and a drain of a p-channel MOS transistor, wherein only one of such p$^+$-type regions is illustrated. Similarly, a pair of n$^+$-type diffusion regions 41b are formed on the p-type well 21c as a source and a drain of an n-channel MOS transistor. Between the pair of diffusion regions 41b, there is formed a channel region as usual, and a polysilicon pattern 43 is provided on the surface of the substrate 21 in correspondence to the well 21c, as a gate electrode of the n-channel MOS transistor. 0f course, the polysilicon pattern 43 is provided on the silicon oxide film covering the surface of the silicon substrate 21. The polysilicon pattern 43 is also provided on the n-type well as the gate electrode of the p-channel MOS transistor.

In the memory cell array region 100, on the other hand, the memory cell transistor is provided on the p-type well 21d formed in the n-type well 21b. As already described, the p-type well 21d has the recessed surface S at a level L that is lower than any of the level of the peripheral circuit region 101 or the marginal region 100a of the memory cell array region 100. Further, the well 21d includes therein an active region defined by the field oxide film 42, wherein the active region includes an n$^+$-type diffusion region 41c acting as a drain of the n-channel MOS transistor to be formed in the well 21d and an n$^+$-type diffusion region 41d that acts as a source of the n-channel MOS transistor. From the drain region 41c, a tall stacked type capacitor electrode 46 extends in the upward direction. On the other hand, a polysilicon pattern 45 acting as a bit line is provided on the source region 41d. Further, the polysilicon pattern 43 is provided on the channel region, defined between the source region 41d and the drain region 41c, as a gate electrode, wherein the gate electrode is provided on the silicon oxide film covering the surface of the well 21d. In the memory cell array region 100, it should further be noted that a polysilicon pattern 44 forming a word line extends on the filed oxide film 42.

In the DRAMs having a stacked type capacitor electrode of FIG. 3, the polysilicon patterns 43–45 are embedded in a silicon oxide film 49a deposited by the CVD process, and the stacked type electrode 46 is provided so as to fill a contact hole 46a formed in such a silicon oxide film 49a. The contact hole 46a is formed in correspondence to the foregoing drain region 41c, and the electrode 46 thus formed contacts with the drain region 41c electrically.

On the surface of the electrode 46, a dielectric film 47 of silicon oxide or SiN is deposited by a thermal oxidation process or CVD process with a thickness of several nanometers, and a polysilicon electrode 48 is deposited further on the dielectric film 47. Further, a planarization layer 49b of SOG or PSG is deposited on the entire surface of the substrate 21 so as to bury the opposing electrode 48 underneath. The insulation layers 49a and 49b are formed with contact holes in correspondence to the diffusion regions 41a and 41b in the peripheral circuit region 101, and a conductor pattern 50 provided on the planarization layer 49b establishes an electrical contact with the diffusion regions 41a or 41b via such contact holes.

In the DRAM of FIG. 3, it should be noted that the memory cell region 100 is formed with the recessed surface S at a level lower than the level of the peripheral circuit region 101 as already noted. Thus, the step appearing on the surface of the planarization layer 49b has a minimum step height, even when a tall memory cell structure is formed as the memory cell capacitor electrode 46. Because of the reduced step height on the surface of the planarization layer 49b, it is possible to expose the conductor pattern 50 by means of high resolution optical exposure system, without experiencing the problem of insufficient focal depth.

In the construction of FIG. 3, it is necessary to provide a contact hole (not shown) penetrating through the insulation layers 49a and 49b for biasing the p-type well 21d in the memory cell region 100. In such a construction, however, there inevitably arises a problem in that the exposure of such a contact hole through the thick insulation layers 49a and 49b by means of high resolution optical systems is difficult because of the limited focal depth pertinent to the high resolution optical system. Further, filling of such a deep contact hole having a large aspect ratio by conductors such as Al tends to invite the problem of poor step coverage. Such difficulties are of course avoided if the diameter of the contact hole is increased, while use of such a large diameter contact hole contradicts with the requirement of miniaturization.

Figure 4:
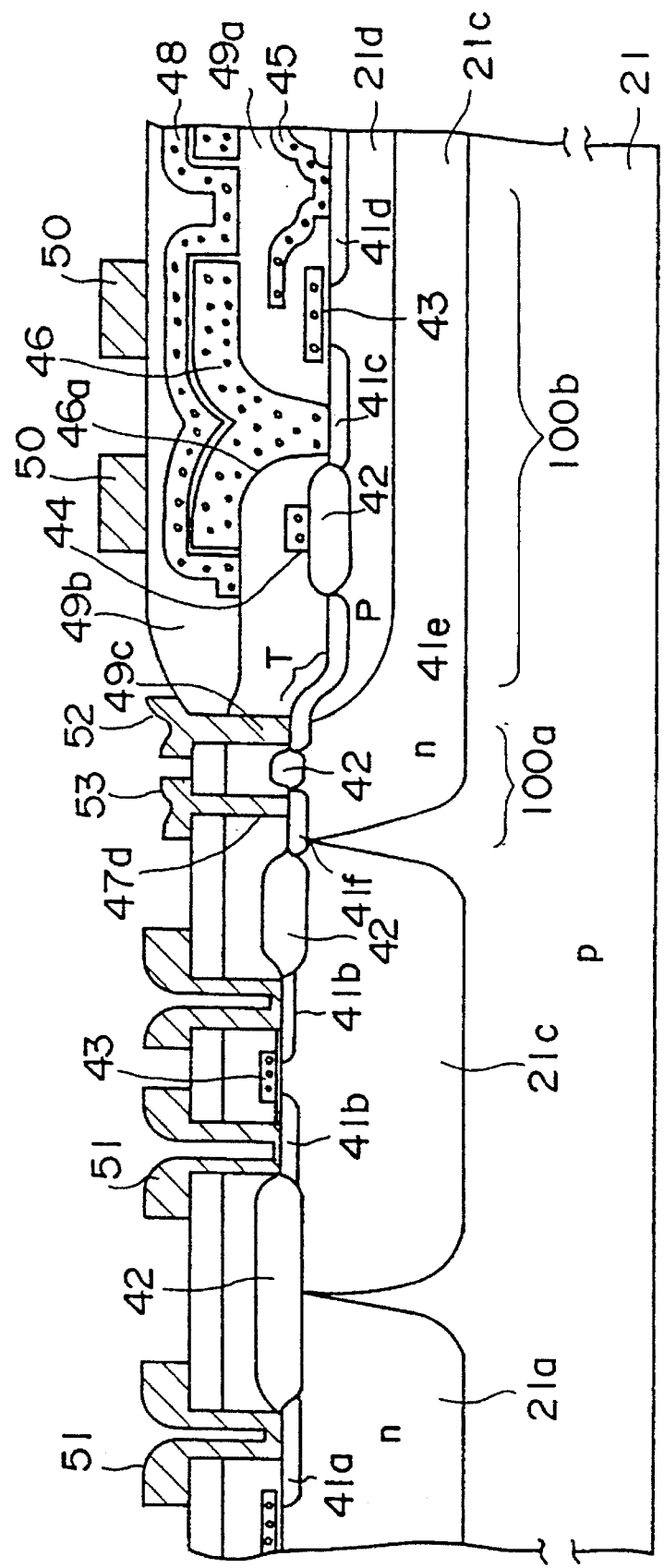
FIG. 4 is a diagram showing the structure of a DRAM according to a second embodiment of the present invention.

FIG. 4 shows the construction of a DRAM according to a second embodiment of the present invention, wherein those parts constructed identically with the previous embodiment are designated by the same reference numerals and the description thereof will be omitted.

Referring to FIG. 4, it will be noted that a diffusion region 41e of the p$^+$-type is formed on the surface of the substrate 21, such that the diffusion region 41e extends from the main region 100b having the recessed surface S to the marginal region 100a across the step T formed at the boundary between the region 100a and the region 100b. In other words, the diffusion region 41e extends from the p-type well 21d having the recessed surface S to the n-type well constituting the marginal region 100a. Thereby, the diffusion region 41e is supplied with a bias voltage via a contact hole 49c penetrating through the insulation layers 49a and 49b by a conductor pattern or electrode 52, and the well 21d is biased to the level of the voltage supplied to the electrode 52.

In such a structure, it should be noted that the contact hole 49c is formed in correspondence to the marginal region 100a and hence has a substantially reduced depth. Thus, the contact hole 49c can be exposed easily by using a high resolution optical exposure system, even when the contact hole 49c has a submicron size. Associated with the reduced aspect ratio of the contact hole 49c, there occurs no substantial problem of step coverage even when the contact hole 49c is filled by the electrode 52 typically of Al.

In the structure of FIG. 4, it should also be noted that the n-type well 21c includes another n$^+$-type diffusion region 41f adjacent to the foregoing p$^+$-type diffusion region 41e, with a region of the field oxide film 42 interposed therebetween, and the diffusion region 41f and hence the well 21c are biased by an electrode 52 provided in a contact hole 47d that penetrates through the insulator layers 49a and 49b in a region corresponding to the diffusion region 41f. It should be noted that the contact hole 47d, too, has a reduced depth and can be exposed without problem by a high resolution optical exposure system. Further, because of the small aspect ratio, the contact hole 47d is filled by the electrode 53, typically of Al, with excellent step coverage.

Further, the present invention is not limited to the embodiments described heretofore, but various variations and modifications may be made without departing from the scope of the invention.

What is claimed is:

1. A method for fabricating a semiconductor memory device, comprising the steps of:

forming, on a first region of a semiconductor substrate of a first conductivity type, a first well of a second, opposite conductivity type;

a mask process for forming a mask pattern on a surface of said semiconductor substrate, such that a second region, which is included in said first region, is exposed;

introducing an impurity element of said first conductivity type into the surface of said semiconductor substrate in correspondence to said second region while using said mask pattern as a mask;

causing a diffusion of said impurity element in said semiconductor substrate to form a second well of said first conductivity type in said first well in correspondence to said second region;

causing an oxidation of the surface of said semiconductor substrate while using said mask pattern as a mask, to form an oxide layer on said second well such that said oxide layer covers said second well; and removing said oxide layer to form a recessed surface on the surface of said semiconductor substrate in correspondence to said second region, such that said recessed surface has a level lower than a level of a surface of said first region.

2. A method as claimed in claim 1, wherein said step of diffusion and said step of oxidation are conducted substantially simultaneously.

3. A method as claimed in claim 1, wherein said method further includes the steps of forming a memory cell array on said second region by forming memory cell transistors and corresponding memory cell capacitors on said recessed surface; and providing a planarized insulator layer having a planarized surface on said semiconductor substrate such that said planarized insulator layer covers said memory cell transistors and said memory cell capacitors.

4. A method as claimed in claim 3, wherein said method further includes the steps of: forming a conductive region in said semiconductor substrate such that said conductive region extends from said recessed surface to a surface of said first region; providing a contact hole on said planarized insulator layer in correspondence to said first region such that said contact hole exposes said conductive region; and filling said contact hole by a conductive material to form an electrode such that said electrode establishes an electrical contact with said exposed conductive region.

5. A method as claimed in claim 1, wherein said step for forming said first well comprises the steps of: forming a second mask pattern on said semiconductor substrate in correspondence to a third region so as to expose said first region; introducing an impurity element of said second conductivity type into said semiconductor substrate in correspondence to said first region while using said second mask pattern as a mask; and causing a diffusion of said impurity element of said second conductivity type in said first region.

6. A method as claimed in claim 5, wherein said method further comprises the steps of: oxidizing said semiconductor substrate to form an oxide film while using said second mask pattern as a mask, such that said oxide film covers said first region of said semiconductor substrate; removing said second mask pattern from said third region; introducing a second impurity element of said first conductivity type into said third region while using said oxide film as a mask; and causing a diffusion of said second impurity element in said third region to form a third well; wherein said step of forming said oxide film that covers said first region is conducted substantially simultaneously to said process of causing the diffusion of said second impurity element.

* * * * *